United States Patent
Yamazaki et al.

(10) Patent No.: US 12,495,634 B2
(45) Date of Patent: Dec. 9, 2025

(54) PHOTOELECTRIC CONVERSION DEVICE AND EQUIPMENT

(71) Applicant: CANON KABUSHIKI KAISHA, Tokyo (JP)

(72) Inventors: Kazuo Yamazaki, Kanagawa (JP); Hideo Kobayashi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 356 days.

(21) Appl. No.: 18/074,642

(22) Filed: Dec. 5, 2022

(65) Prior Publication Data

US 2023/0178580 A1 Jun. 8, 2023

(30) Foreign Application Priority Data

Dec. 7, 2021 (JP) .................................. 2021-198362

(51) Int. Cl.
*H10F 39/00* (2025.01)
*H10F 39/18* (2025.01)

(52) U.S. Cl.
CPC .......... *H10F 39/811* (2025.01); *H10F 39/18* (2025.01); *H10F 39/809* (2025.01); *H10F 39/813* (2025.01)

(58) Field of Classification Search
CPC ...... H10F 39/811; H10F 39/18; H10F 39/809; H10F 39/813; H10F 10/163; H10F 10/169; H10F 39/1865; H10H 20/8232; A23B 99/00; H10D 62/152; H10D 84/80; H10D 62/117

See application file for complete search history.

(56) References Cited

U.S. PATENT DOCUMENTS

| | | | |
|---|---|---|---|
| 7,816,755 | B2 | 10/2010 | Yamazaki |
| 7,889,254 | B2 | 2/2011 | Kochi |
| 7,990,440 | B2 | 8/2011 | Kobayashi |
| 8,049,799 | B2 | 11/2011 | Sonoda |
| 8,325,260 | B2 | 12/2012 | Yamazaki |

(Continued)

FOREIGN PATENT DOCUMENTS

| | | |
|---|---|---|
| JP | 2011-114731 A | 6/2011 |
| JP | 2012-089739 A | 5/2012 |

(Continued)

OTHER PUBLICATIONS

Office Action dated Jul. 4, 2023, in Japanese Patent Application No. 2021-198362.

*Primary Examiner* — Mohammad A Rahman
(74) *Attorney, Agent, or Firm* — Venable LLP

(57) ABSTRACT

A photoelectric conversion device includes a first substrate and a second substrate laminated one on another. The first substrate has a pixel region having a photoelectric conversion element for acquiring a pixel signal, the second substrate has a processing circuit for processing the pixel signal, a first wire, which includes a plurality of wire layers and which is a common wire to be connected in common with a plurality of pixels in the pixel region, is arranged, and a second wire, which includes a plurality of wire layers and which is a wire for supplying a power supply voltage to the processing circuit, is arranged. At least a part of a shield wire, which is not to be electrically connected with any of the first wire and the second wire, is arranged between the first wire and the second wire.

15 Claims, 7 Drawing Sheets

(56) References Cited

U.S. PATENT DOCUMENTS

| | | |
|---|---|---|
| 8,519,459 B2 | 8/2013 | Horiike et al. |
| 8,710,558 B2 | 4/2014 | Inoue |
| 8,760,337 B2 | 6/2014 | Yamazaki |
| 8,810,706 B2 | 8/2014 | Yamazaki |
| 8,836,313 B2 | 9/2014 | Takagi |
| 8,884,391 B2 | 11/2014 | Fudaba |
| 8,946,798 B2 | 2/2015 | Horiike et al. |
| 9,060,139 B2 | 6/2015 | Yamazaki |
| 9,136,304 B2 | 9/2015 | Maeda |
| 9,264,641 B2 | 2/2016 | Kobayashi |
| 9,288,415 B2 | 3/2016 | Yamazaki |
| 9,305,954 B2 | 4/2016 | Kato |
| 9,357,122 B2 | 5/2016 | Kususaki |
| 9,407,847 B2 | 8/2016 | Maehashi |
| 9,438,828 B2 | 9/2016 | Itano |
| 9,438,841 B2 | 9/2016 | Yamazaki |
| 9,509,931 B2 | 11/2016 | Kobayashi |
| 9,602,752 B2 | 3/2017 | Kobayashi |
| 9,667,901 B2 | 5/2017 | Sakai |
| 9,681,076 B2 | 6/2017 | Oguro |
| 9,762,840 B2 | 9/2017 | Yamazaki |
| 10,015,430 B2 | 7/2018 | Kobayashi |
| 10,057,529 B2 | 8/2018 | Saito et al. |
| 10,249,670 B2 | 4/2019 | Seko |
| 10,403,658 B2 | 9/2019 | Takada |
| 10,609,316 B2 | 3/2020 | Kobayashi |
| 10,834,354 B2 | 11/2020 | Kobayashi |
| 10,854,678 B2 | 12/2020 | Isono et al. |
| 10,903,253 B2 | 1/2021 | Wada et al. |
| 10,992,886 B2 | 4/2021 | Yamazaki |
| 11,114,505 B2 | 9/2021 | Isono et al. |
| 11,115,608 B2 | 9/2021 | Sakai |
| 11,268,851 B2 | 3/2022 | Kobayashi |
| 11,310,453 B2 | 4/2022 | Takada |
| 11,431,929 B2 | 8/2022 | Kobayashi |
| 11,463,644 B2 | 10/2022 | Soda |
| 11,470,275 B2 | 10/2022 | Kobayashi |
| 11,496,704 B2 | 11/2022 | Sato |
| 11,637,147 B2 | 4/2023 | Isono et al. |
| 2012/0105696 A1 | 5/2012 | Maeda |
| 2016/0336371 A1 | 11/2016 | Seko |
| 2021/0021770 A1 | 1/2021 | Nakazawa |
| 2021/0021777 A1 | 1/2021 | Kobayashi et al. |
| 2021/0314508 A1 | 10/2021 | Kusano |
| 2021/0352801 A1 | 11/2021 | Miyamoto et al. |
| 2021/0360180 A1 | 11/2021 | Saito |
| 2022/0030164 A1 | 1/2022 | Kobayashi |
| 2022/0201233 A1 | 6/2022 | Takada |
| 2022/0247964 A1 | 8/2022 | Kobayashi |
| 2022/0272295 A1 | 8/2022 | Kobayashi |
| 2022/0302199 A1 | 9/2022 | Kobayashi |
| 2022/0303484 A1 | 9/2022 | Kobayashi |
| 2022/0303485 A1 | 9/2022 | Kobayashi |
| 2022/0303486 A1 | 9/2022 | Kobayashi |
| 2023/0041974 A1 | 2/2023 | Kobayashi |
| 2023/0070568 A1 | 3/2023 | Kobayashi |
| 2023/0072715 A1 | 3/2023 | Kobayashi |
| 2023/0188869 A1* | 6/2023 | Nakamura ............ H04N 1/028 348/308 |

FOREIGN PATENT DOCUMENTS

| | | |
|---|---|---|
| JP | 2012-094720 A | 5/2012 |
| JP | 2015-138862 A | 7/2015 |
| JP | 2018-007000 A | 1/2018 |
| JP | 2019-102947 A | 6/2019 |
| JP | 2019-129322 A | 8/2019 |
| JP | 2020-043219 A | 3/2020 |
| JP | 2021-019256 A | 2/2021 |
| JP | 2021-150898 A | 9/2021 |

* cited by examiner

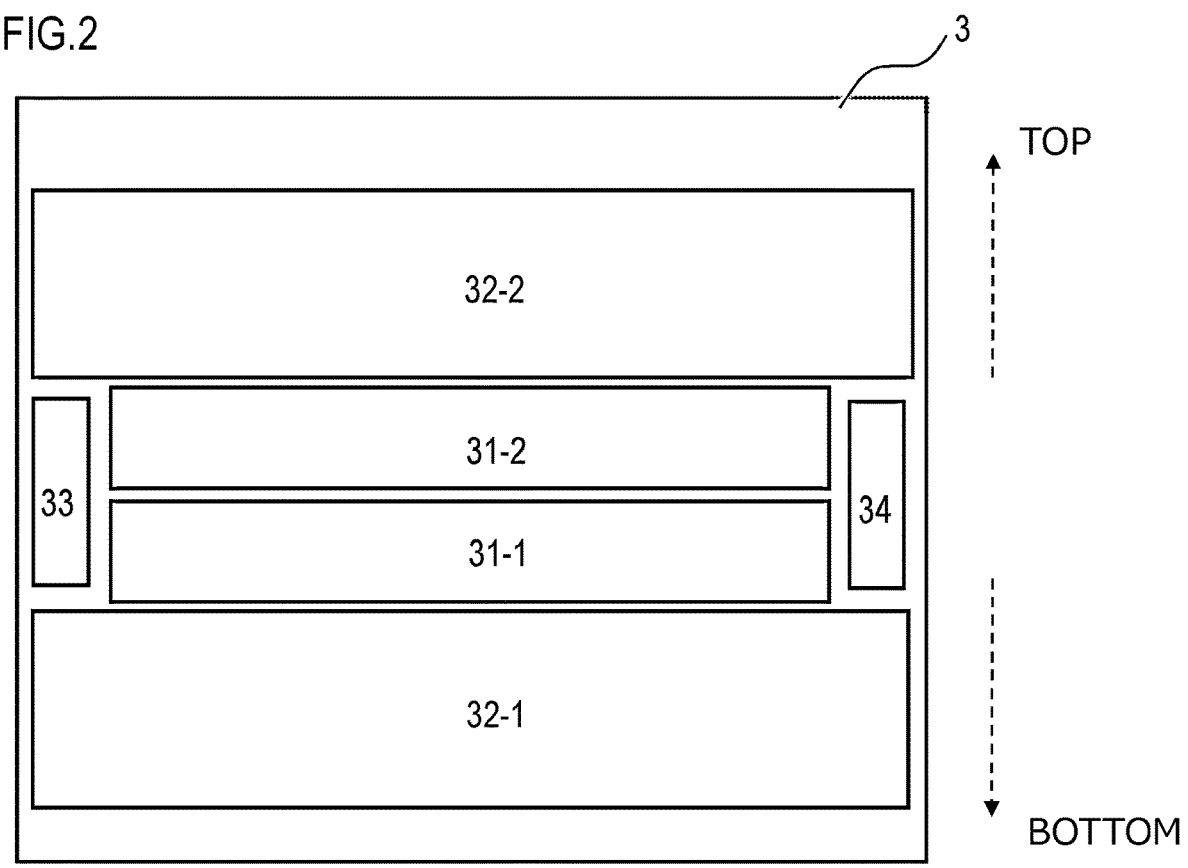

PHOTOELECTRIC CONVERSION DEVICE AND EQUIPMENT

BACKGROUND OF THE INVENTION

Field of the Invention

The present invention relates to a photoelectric conversion device and equipment.

Description of the Related Art

As a solid-state image pickup element for use in a digital still camera, or the like, a CMOS image sensor is known. For a CMOS image sensor, LSIs are bonded together on a wafer level or a chip level for lamination, thereby forming a high performance LSIs into one chip. However, when semiconductors are brought closer to each other, the effect of crosstalk caused due to the mutual element operations undesirably deteriorates the image quality.

Japanese Patent Application Publication No. 2015-138862 discloses a technology in which, on a pixel substrate of a solid-state image pickup element (photoelectric conversion device) including the pixel substrate and a signal processing substrate to be laminated on the pixel substrate, a first wire is arranged at the upper layer of a vertical signal line.

In accordance with Japanese Patent Application Publication No. 2015-138862, the arrangement of the first wire as a shield wire suppresses the cross talk caused between the upper and lower elements.

In Japanese Patent Application Publication No. 2015-138862, a control line, a ground wire, or a power supply wire on the pixel substrate is used as the first wire. For this reason, the first wire and a vertical output line may cause crosstalk, whereby the current or the voltage at the control line, the ground wire, or the power supply wire is changed. As a result, the output level of the pixel signal is indirectly varied, which may cause deterioration of the image quality.

SUMMARY OF THE INVENTION

Under such circumstances, it is an object of the present invention to suppress the crosstalk caused at the control line, the ground wire, the power supply wire, or the like in a photoelectric conversion device including a plurality of substrates laminated therein.

According to an aspect of the present disclosure, it is provided a photoelectric conversion device including a first substrate and a second substrate laminated one on another, wherein the first substrate has a pixel region having a photoelectric conversion element for acquiring a pixel signal, the second substrate has a processing circuit for processing the pixel signal, a first wire, which is a wire including a plurality of wire layers and which is a common wire to be connected in common with a plurality of pixels in the pixel region, is arranged, a second wire, which is a wire including a plurality of wire layers and which is a wire for supplying a power supply voltage to the processing circuit, is arranged, and at least a part of a shield wire, which is not to be electrically connected with any of the first wire and the second wire, is arranged between the first wire and the second wire.

Further features of the present invention will become apparent from the following description of exemplary embodiments with reference to the attached drawings.

BRIEF DESCRIPTION OF THE DRAWINGS

FIG. 2 is a view for illustrating signal processing substrate in accordance with Embodiment 1;

DESCRIPTION OF THE EMBODIMENTS

Below, with reference to the accompanying drawings, embodiments will be described. In each embodiment described below, as one example of a photoelectric conversion device, a solid-state image pickup element (image pickup device) will be mainly described. However, each embodiment is not limited to the solid-state image pickup element (image pickup device), and is also applicable to other examples of the photoelectric conversion device. Examples thereof may include a distance measuring device (device for distance measurement or the like using (focus detection or TOF (Time Of Flight)) and a photometric device (device for measuring the incident light amount, or the like).

Embodiment 1

In the solid-state image pickup element (photoelectric conversion device) in accordance with Embodiment 1, a pixel substrate (pixel chip) and a signal processing substrate (signal processing chip) are laminated one on another. Below, the direction in which the pixel substrate is laminated with respect to the signal processing substrate is referred to as the "lamination direction".

Figure 1B:
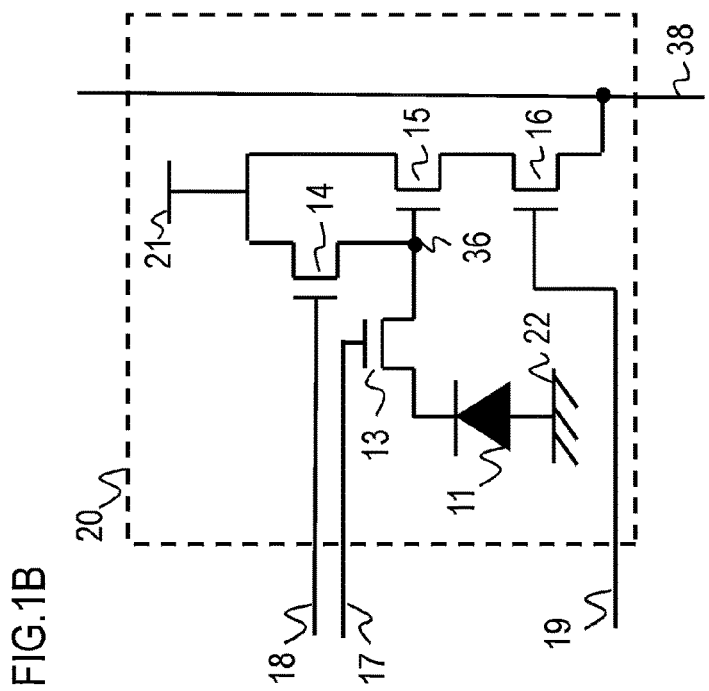
FIGS. 1A and 1B are each a view for illustrating a pixel substrate in accordance with Embodiment 1.
Figure 1A:
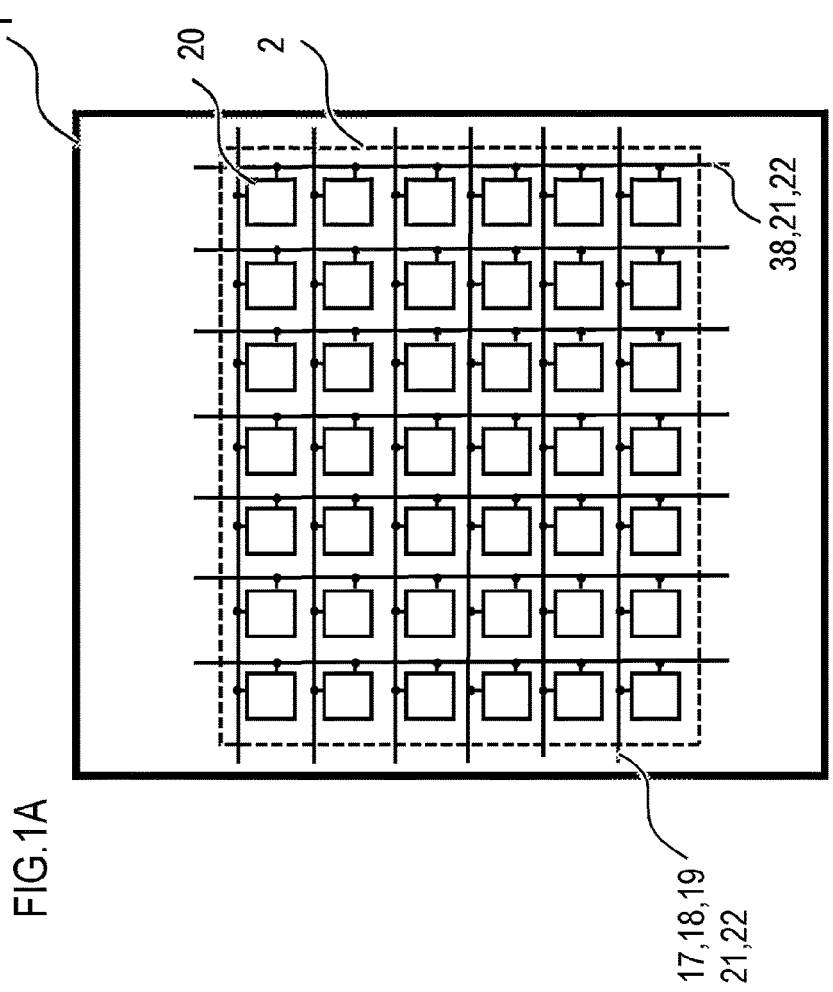

<Pixel Substrate> FIG. 1A is a block view of a pixel substrate (pixel chip) in accordance with Embodiment 1. FIG. 1A is a view of the pixel substrate as seen from the lamination direction. For the pixel substrate, pixels 20 for acquiring a pixel signal at a semiconductor substrate 1 (e.g., silicon substrate) are arrayed two dimensionally, thereby forming a pixel region 2.

Further, as shown in FIG. 1B, the pixel 20 has a photodiode 11 (photoelectric conversion element) and a plurality of pixel transistors. The plurality of pixel transistors are a transfer transistor 13, a reset transistor 14, an amplification transistor 15, and a select transistor 16.

The gate terminal of the transfer transistor 13 is connected with a transfer control line 17. The gate terminal of the reset transistor 14 is connected with a reset control line 18. The gate terminal of the select transistor 16 is connected with a select control line 19. The source terminal of the select transistor 16 is connected with a vertical output line 38.

Further, the drain terminal of the reset transistor 14 and the drain terminal of the amplification transistor 15 are connected with a first wire 21 (power supply). The anode terminal of the photodiode 11 is connected with a second wire 22 (ground). Respective back gate terminals of the plurality of pixel transistors are connected with the second wire 22 (ground). The first wire 21 is a power supply wire (the power supply wire of the pixel region 2) to be connected with a power supply, and the second wire 22 is a wire (the ground wire of the pixel region 2) to be connected with the ground. The first wire 21 is a wire for supplying a first power supply voltage to the pixel 20. The second wire 22 is a wire for supplying a second power supply voltage to the pixel 20. In the present embodiment, it is assumed that the first power supply voltage is VDD (Voltage Drain), and that the second power supply voltage is a ground voltage (voltage of 0 V). Incidentally, in the present embodiment, the second wire 22 is assumed to be a ground wire connected with a ground, and may only be connected with others than the power supply to be connected with the first wire 21. In other words, the second wire 22 may only be the wire for supplying a different power supply voltage from that of the first wire 21 (the first power supply voltage and the second power supply voltage may only be different from each other).

As shown in FIG. 1A and FIG. 1B, as the common wire common among a plurality of pixels 20 in the line direction, the transfer control line 17, the reset control line 18, the select control line 19, the first wire 21, and the second wire 22 are respectively connected to the plurality of pixels 20. Further, as the common wire common among a plurality of pixels 20 in the row direction, the first wire 21, the second wire 22, and the vertical output line 38 are respectively connected to the plurality of pixels 20. For this reason, when the voltage (or the current) is changed at the common wires by crosstalk, a vertical stripe or a lateral stripe is formed in the image acquired by the plurality of pixels 20 (the deterioration of the image quality is caused).

Incidentally, the deterioration of the image quality due to crosstalk is caused not only in the case where the voltage of the control line (the reset control line 18, the transfer control line 17, or the select control line 19), or the vertical output line 38 is varied, but also in the case where the voltage of the power supply or the ground is varied. This is because the first wire 21 is connected with the drain terminals of the amplification transistor 15 and the reset transistor 14, and the second wire 22 is connected with the anode of the photodiode 11 and the back gate terminal of each transistor. In other words, this is because the voltage of the vertical output line 38 is varied when the voltage of the power supply or the ground is varied.

<Signal Processing Substrate> FIG. 2 is a block view of a signal processing substrate (signal processing chip). FIG. 2 is a view of the signal processing substrate as seen from the lamination direction. The signal processing substrate has AD conversion circuits 31-1 and 31-2, processing circuits 32-1 and 32-2, a timing generation circuit 33, and a voltage generation circuit 34 on a semiconductor substrate 3 (silicon substrate).

The AD conversion circuit 31-1 and the AD conversion circuit 31-2 convert a pixel signal acquired from the pixel substrate (pixel 20) from an analog signal into a digital signal. The processing circuit 32-1 and the processing circuit 32-2 execute processing in response to the pixel signal converted into a digital signal (processing according to the pixel signal). The AD conversion circuit 31-1 and the AD conversion circuit 31-2 are arranged vertically symmetrically. The processing circuit 32-1 and the processing circuit 32-2 are arranged vertically symmetrically. For example, the processing with respect to an odd row of pixels 20 is performed by the lower-side AD conversion circuit 31-1 and processing circuit 32-1, and the processing with respect to an even row of pixels 20 is performed by the upper-side AD conversion circuit 31-2 and processing circuit 32-2.

Whereas, when the solid-state image pickup element is a sensor in the Bayer arrangement, whether the AD conversion circuit 31-1 and the processing circuit 32-1 (the AD conversion circuit 31-2 and the processing circuit 32-2) perform the processing with respect to the pixels 20, or not may be determined according to which pixel of GrGB and RB the pixel 20 is.

The timing generation circuit 33 supplies a control signal to the AD conversion circuits 31-1 and 31-2, and the processing circuits 32-1 and 32-2. The voltage generation circuit 34 supplies a reference voltage to the AD conversion circuits 31-1 and 31-2, and the processing circuits 32-1 and 32-2. Incidentally, the timing generation circuit 33 and the voltage generation circuit 34 also supply a reference voltage and a control signal to the pixel substrate.

Incidentally, below, when it is not necessary to distinguish between the AD conversion circuit 31-1 and the AD conversion circuit 31-2, the AD conversion circuit 31-1 and the AD conversion circuit 31-2 will be collectively referred to as the "AD conversion circuit 31". Similarly, when it is not necessary to distinguish between the processing circuit 32-1 and the processing circuit 32-2, the processing circuit 32-1 and the processing circuit 32-2 will be collectively referred to as the "processing circuit 32".

Figure 3:
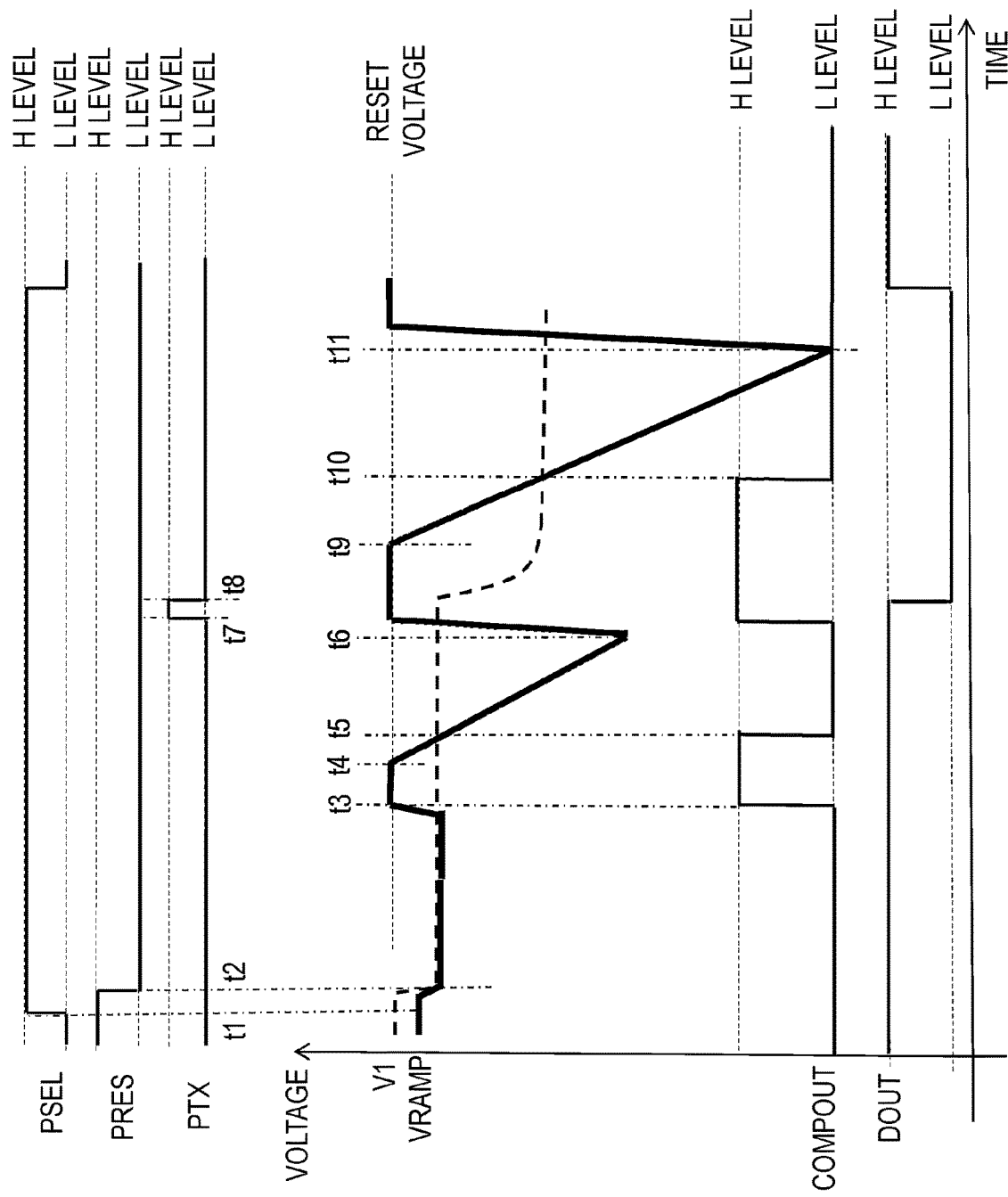
FIG. 3 is a view for illustrating the driving timing of each substrate in accordance with Embodiment 1.

<Driving Timing> FIG. 3 is a timing chart for illustrating respective driving timings (the changes in signal level of the signal) of the pixel substrate and the signal processing substrate.

Below, the transfer transistor 13, the reset transistor 14, and the select transistor 16 respectively operate in response to the control signal supplied from the timing generation circuit 33. The transistors are changed into a conduction (ON) state when a signal at a High level (hereinafter, a H level) is supplied as a control signal. Whereas, the transistors are changed into a non-conduction (OFF) state when a signal at a Low level (hereinafter, a L level) is supplied as a control signal.

FIG. 3 shows a change in voltage (a change in signal level) according to the change with time of a signal PRES, a signal PSEL, a signal PTX, a signal V1, a signal VRAMP, and a signal COMPOUT.

The signal PRES, the signal PSEL, and the signal PTX are control signals to be supplied to the reset control line 18, the select control line 19, and the transfer control line 17 shown in FIGS. 1A and 1B, sequentially, respectively. The signal V1 is an output signal of the vertical output line 38. The signal VRAMP is a ramp signal (a reference signal changed in voltage with time). The signal VRAMP is, in the present embodiment, generated at the voltage generation circuit 34. The signal COMPOUT is a signal outputted by a comparison circuit (comparator) in the inside of the AD conversion circuit 31. The signal DOUT is a signal for controlling the operation of the signal processing of the processing circuit 32.

First, when the signal level of the signal PRES is rendered to a H level at a time before a time of t1, the reset transistor 14 of the pixel 20 is changed into an ON state. As a result, the gate voltage of the amplification transistor 15 is reset to a voltage at a reset level.

When the signal level of the signal PSEL is set at a H level at a time of t1, the select transistor 16 is changed into an ON state. Then, a current is supplied from a current source to the amplification transistor 15 via the vertical output line 38 and the select transistor 16. As a result, the amplification transistor 15 operates as a part of a source follower circuit. Then, a signal corresponding to the gate level of the amplification transistor 15 is outputted to the vertical output line 38 via the select transistor 16.

At a time of t2, the signal level of the signal PRES is changed to a L level. As a result, the reset transistor 14 is changed into an OFF state. When the signal level of the signal PRES is changed from a H level to a L level, the charge injection generated at the reset transistor 14 changes the voltage (electric potential) of a node 36 (see FIG. 1B). The node 36 is the node for electrically connecting the gate terminal of the amplification transistor 15, the source terminal of the reset transistor 14, and the drain terminal of the transfer transistor 13 with one another. A change in voltage of the node 36 changes the signal level of the signal V1 to be outputted from the pixel 20 to the vertical output line 38. A signal V1 to be outputted by the pixel 20 to the vertical output line 38 at this step is expressed as an "N signal".

At a time of t3, the voltage generation circuit 34 once raises the voltage of the signal VRAMP to the reset voltage. As a result, the signal level of the signal COMPOUT is changed to a H level.

From a time of t4, the voltage generation circuit 34 monotonously reduces the voltage of the signal VRAMP with an elapse of time. Further, at a timing of a time of t4, the AD conversion circuit 31 starts count of the clock frequency for AD conversion of the N signal (counting of clock signals).

The conversion circuit of the AD conversion circuit 31 performs the comparison operation of the signal V1 and the signal VRAMP supplied from the voltage generation circuit 34. The comparison circuit changes the signal level of the signal COMPOUT to be outputted when the size relation between the two signals to be compared is reversed.

The AD conversion circuit 31 has a counter circuit. At a time of t4, simultaneously with the start of monotonous reduction of the voltage value of the signal VRAMP, the counter circuit starts count of the clock frequency.

At a time of t5, the size relation between the signal V1 and the signal VRAMP is reversed, so that the signal level of the signal COMPOUT starts to be changed from a H level to a L level.

The AD conversion circuit 31 acquires the clock frequency (the counted time) from a time of t4 to a time of t5 as the value of the signal obtained by digital converting the N signal. Below, the signal obtained by digital converting the N signal is expressed as the "digital N signal".

At a time of t6, the voltage generation circuit 34 terminates the monotonous change in voltage (electric potential) of the signal VRAMP with an elapse of time, and then, raises the voltage of the signal VRAMP to the reset level (the voltage at the time point of a time of t3) again.

Thus, the operation performed at times of t3 to t6 converts (AD converts) the analog signal (signal V1) outputted from the vertical output line 38 into a digital signal, thereby generating a digital N signal. The digital N signal is a signal mainly including a component of characteristic variation (noise) from one row to another. Incidentally, the digital N signal includes at least one of the noise upon reset of the reset transistor 14, the offset signal of the comparison circuit, and the like.

At a time of t7, the timing generation circuit 33 outputs a H level signal PTX, and turns the transfer transistor 13 on. As a result, the electric charge (the photoelectrically converted pixel signal) generated at the photodiode 11 is transferred.

At a time of t8, the timing generation circuit 33 changes the signal level of the signal PTX to a L level. The amplification transistor 15 outputs a signal corresponding to the amount of the electric charges transferred from the photodiode 11 to the vertical output line 38 via the select transistor 16 as a signal V1. As a result, the voltage of the signal V1 is reduced. The signal V1 also includes the component of the N signal of the pixel 20. The signal V1 at this step is expressed as the "S+N signal". The S+N signal is a signal based on the electric charges generated by only some photodiodes 11 of the plurality of photodiodes 11. The signal V1 outputted to the vertical output line 38 is inputted to the comparison circuit of the AD conversion circuit 31.

At a time of t9, the voltage generation circuit 34 monotonously reduces the voltage of the signal VRAMP with an elapse of time. Further, the counter circuit of the AD conversion circuit 31 starts to count the clock frequency simultaneously with the start of reduction of the signal level of the signal VRAMP as with the previous AD conversion of the N signal.

At a time of t10, the size relation between the signal V1 (i.e., the S+N signal) and the signal VRAMP is reversed.

At a time of t11, the voltage generation circuit 34 terminates the monotonous change in voltage (electric potential) with an elapse of time of the signal VRAMP, and changes the signal VRAMP to the reset level again.

Then, the AD conversion circuit 31 acquires the value obtained by measuring the clock frequency (time) from the time of t9 to the time of t10 as the value of the digital signal obtained by AD converting the S+N signal. The digital signal obtained by AD converting the S+N signal is expressed as the "digital S+N signal".

Subsequently to the time of t11, sequentially, the digital N signal and the digital S+N signal are outputted to the processing circuit 32. In the present embodiment, during the period of the H level of the signal DOUT, the digital N signal and the digital S+N signal are outputted. During the period of the L level of the signal DOUT, the digital N signal and the digital S signal are not outputted.

The processing circuit 32 performs differential processing of the digital N signal and the digital S+N signal, thereby to be able to acquire only the digital S signal of a signal in accordance with the change in signal V1.

Further, during the period in which the signal DOUT is at a H level, the processing circuit 32 performs various digital processing including correction such as offset adjustment or gain adjustment of the dark level using an optical black pixel, sorting of data for output, and the like. For this reason, during the period in which the signal DOUT is at a H level, at the processing circuit 32, various signal processing is performed (the processing circuit 32 operates at a high speed), and a very large amount of current passes therethrough.

In contrast, during the period in which the signal DOUT is at a L level, at the processing circuit 32, signal processing is not performed (the processing circuit 32 hardly operates, and hence), the consumption of the current is low.

Figure 4B:
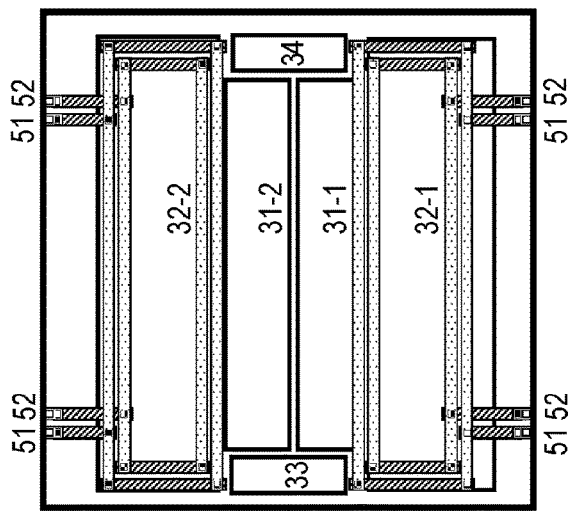
FIGS. 4A to 4C are each a view for illustrating the arrangement of a wire in accordance with Embodiment 1.
Figure 4A:
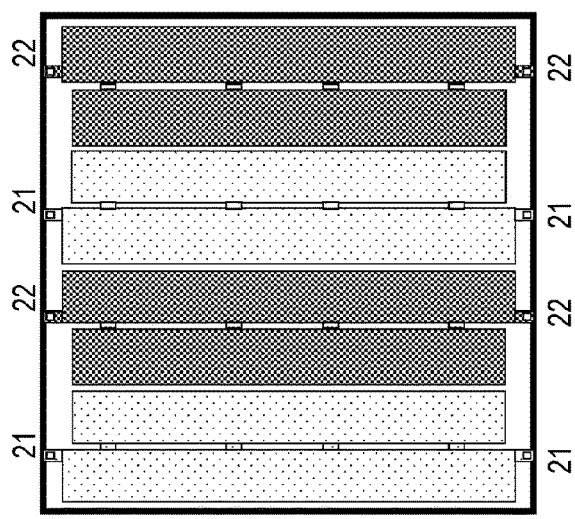
Figure 4C:
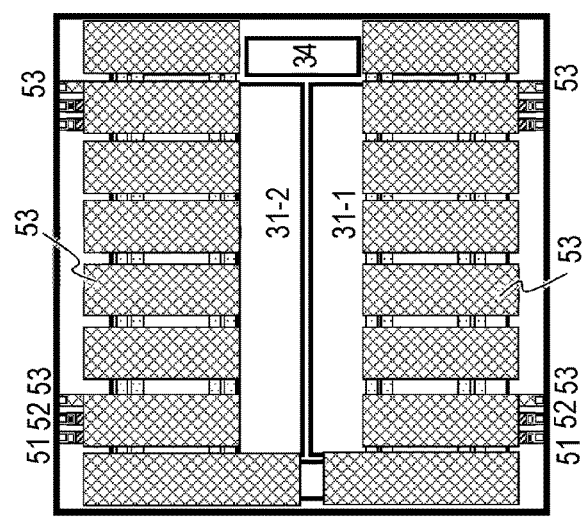

<Configuration of Wire> FIGS. 4A to 4C are each a block view illustrating the wires to be laminated of the pixel substrate and the signal processing substrate in the present embodiment. FIG. 4A shows the wires at the pixel substrate. FIGS. 4B and 4C each show the wires at the signal processing substrate. FIG. 4B is a block view showing other wires than a shield wire 53. FIG. 4C is a view showing the shield wire 53 in addition to the wires shown in FIG. 4B.

A first wire 51 in FIG. 4B is a power supply wire of the processing circuit 32, and a second wire 52 is a ground wire of the processing circuit 32. The first wire 51 is a wire (power supply wire) for supplying a first power supply voltage to the processing circuit 32. The second wire 52 is a wire for supplying a second power supply voltage to the processing circuit 32. In the present embodiment, it is assumed that the first power supply voltage is VDD (Voltage Drain), and that the second power supply voltage is a ground voltage (a voltage of 0 V). The shield wire 53 suppresses the crosstalk caused between the two wires. The shield wire 53 may be connected with a given wire so long as it is not electrically connected with a common wire (such as the first wire 21, the second wire 22, the vertical output line 38, or the control line) of the pixel substrate, and is not electrically connected with the first wire 51 and the second wire 52. In the present embodiment, the shield wire 53 is connected with the ground wire (the wire for connecting the timing generation circuit 33 and the ground) of the timing generation circuit 33. Incidentally, although the second wire 52 is, in the present embodiment, assumed to be a ground wire connected with a ground, it may only be connected with others than the power supply with which the first wire 51 is connected. In other words, it is essential only that the second wire 52 is a wire for supplying a different power supply voltage from that of the first wire 51.

During the period in which the signal level of the signal DOUT shown in FIG. 3 is a H level, the consumption of a current at the processing circuit 32 is high. On the other hand, during the period in which the signal level of the signal DOUT is a L level, the consumption of a current at the processing circuit 32 is low. For this reason, the first wire 51 and the second wire 52 largely vary in voltage during the period in which the signal level of the signal DOUT is a H level, and less vary in voltage during the period of a L level.

The pixel substrate and the signal processing substrate are laminated one on another, and are bonded with each other so that mutual wires are adjacent to each other. For this reason, when the shield wire 53 is not arranged, the first wire 51 and the second wire 52 come in contact with the first wire 21 and the second wire 22. As a result, crosstalk is caused, so that the voltage of the power supply or the ground connected with the pixel 20 may vary. Then, the characteristics of the pixel may be deteriorated (the image quality may be deteriorated).

When during the period of the times of t2 to t6 in which reading of the N signal or the like is performed, the signal level of the signal DOUT is a H level, or when during the period of the times of t7 to t11 in which reading of the S+N signal or the like is performed, the signal level of the signal DOUT is a L level, particularly, the image quality is deteriorated. This is due to the following: the amount of variation of the voltage of the power supply is different between during the S+N period (the period in which reading or the AD conversion of the S+N signal is performed) and during the N period (the period in which the reading or the AD conversion of the N signal is performed); for this reason, the difference between the S+N signal and the N signal cannot be properly taken.

Further, even when in any of the S+N period and the N period, the signal level of the signal DOUT is a H level, reading of a signal is performed during the period in which the voltage of the power supply varies. For this reason, the deterioration of the image quality is caused.

Figure 5:
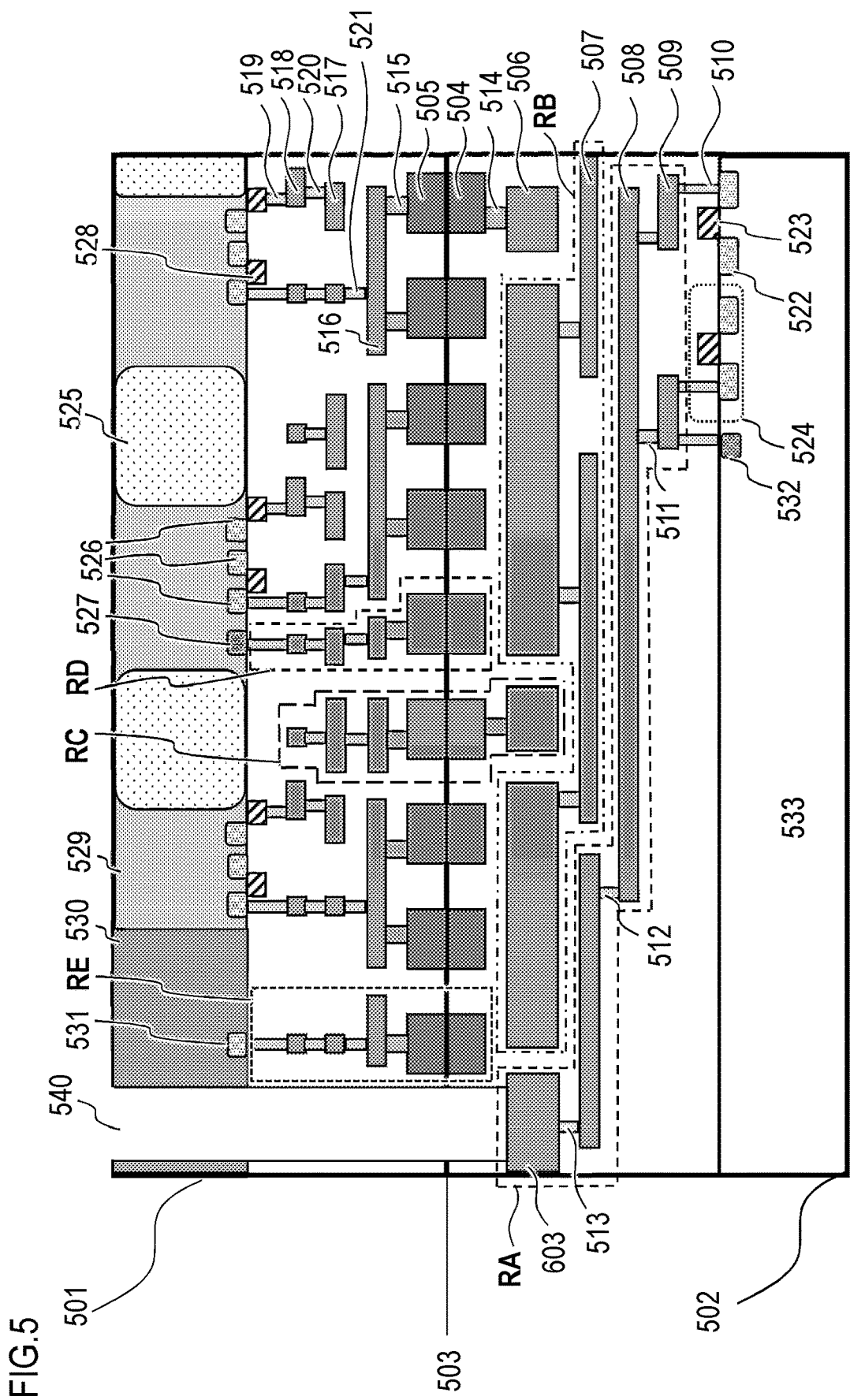
FIG. 5 is a view for illustrating the layer configuration of a solid-state image pickup element in accordance with Embodiment 1.

<Layer Configuration of Solid-State Image Pickup Element> FIG. 5 is a cross sectional view of a solid-state image pickup element with a pixel substrate and a signal processing substrate laminated therein cut in the lamination direction.

A wire RA in FIG. 5 corresponds to the second wire 52, a wire RB corresponds to the shield wire 53, a wire RD corresponds to the second wire 22, and a wire RE corresponds to the first wire 21. Each of the wires RA to RE is one region physically connected with a connection part, a via, and a wire layer described later.

In FIG. 5, a pixel substrate 501 and a signal processing substrate 502 are laminated one on another. A connection surface 503 is a bonded surface (interface) of the pixel substrate 501 and the signal processing substrate 502. A connection part 504 and a connection part 505 are connection parts of the pixel substrate 501 and the signal processing substrate 502 at the connection surface 503, respectively. A plurality of the connection parts 504 and the connection parts 505 are also arranged in the pixel region 2. In FIG. 5, the connection part 504 and the connection part 505 are arranged at equal pitches (equal intervals). Incidentally, the connection part 504 and the connection part 505 can be formed of the equal member, and hence, may be grasped as a connection region collectively in one unit.

<Layer Configuration of Signal Processing Substrate> First, a description will be given to the layer configuration of the signal processing substrate 502. A wire layer 506 is the wire layer (metal layer) closest to the connection surface 503. At the signal processing substrate, in the order of proximity to the connection surface 503, the wire layer 506, a wire layer 507, a wire layer 508, and a wire layer 509 are formed.

A via 511, a via 512, and a via 513 are vias (connection parts) for establishing an electrical connection between the wire layers. The via 513 establishes an electrical connection between the wire layer 506 and the wire layer 507. The via 512 establishes an electrical connection between the wire layer 507 and the wire layer 508. The via 511 establishes an electrical connection between the wire layer 508 and the wire layer 509.

The via 510 establishes an electrical connection between the wire layer 509 and the silicon substrate (semiconductor substrate). Although not shown, the via 510 is also used for establishing an electrical connection between the wire layer 509 and a POL silicon 523.

On the silicon substrate (semiconductor substrate) in the signal processing substrate, an N type diffusion region 522, a POL silicon 523, a P type diffusion region 532, and a P type diffusion region 533 are formed. The N type diffusion region 522 is an N conductivity type diffusion region in the silicon substrate. The N type diffusion region 522 and the POL silicon 523 form an NMOS transistor 524.

The P type diffusion region 533 is a P conductivity type diffusion region in the silicon substrate. The P type diffusion region 533 is also the back gate of the NMOS transistor 524. The back gate of the NMOS transistor 524 has a voltage fixed in a P+ conductivity type diffusion region, and is connected with the wire RA. Incidentally, the PMOS transistor is also similarly arranged on the signal processing substrate 502, which is omitted for simplification of the description in FIG. 5.

Some of the plurality of wire layers 506 form a pad 603. To the pad 603, a voltage is externally supplied by a hole 540 penetrating through the pixel substrate. The via 514 establishes an electrical connection between the wire layer 506 and the connection part 504.

<Layer Configuration of Pixel Substrate> Subsequently, a description will be given to the layer configuration of the pixel substrate 501. The wire layer 516, the wire layer 517, and the wire layer 518 are metal wires of the pixel substrate. Whereas, the via 521 is the via for establishing an electrical connection between the wire layer 516 and the wire layer 517. The via 520 is the via for establishing an electrical connection between the wire layer 517 and the wire layer 518. The via 519 is the via for establishing an electrical connection between the wire layer 518 and the POL silicon gate 528. Further, the via 519 is also used for establishing an electrical connection between the wire layer 518 and the silicon substrate (semiconductor). The via 515 is the via for establishing an electrical connection between the connection part 505 and the wire layer 516.

On the silicon substrate (semiconductor substrate) at the pixel substrate, an N type diffusion region 525, an N type diffusion region 526, a P type diffusion region 527, a P type diffusion region 529, an N type diffusion region 530, and an N+ diffusion region 531 are formed.

The N type diffusion region 525 forms a photodiode. The N type diffusion region 526 and the POL silicon gate 528 form an NMOS transistor. The back gate of the NMOS transistor and the anode of the photodiode are connected with a ground (ground electrode) in the P type diffusion region 527. The N+ diffusion region 531 is connected with the power supply (the electrode of the power supply) of the pixel substrate.

Then, a description will be given to the wires of the pixel substrate and the signal processing substrate. The wire RA is connected with a ground of the processing circuit 32. With the wire RA, repetition of turning ON/OFF of the transistor at the processing circuit 32 causes a change in current. Therefore, with the wire RA, the voltage is largely varied, and hence the wire RA may become a generation source of a noise.

The wire RB is a shield wire. The wire RC is an output line of a pixel, and corresponds to the vertical output line 38 in FIGS. 1A and 1B. The wire RC is connected from the pixel substrate to the signal processing substrate. The wire RD is the second wire 22 of the pixel substrate (pixel region). The wire RE is the first wire 21 of the pixel substrate.

The wire RB as a shield wire is arranged between each of the wire RC, the wire RD, and the wire RE, and the wire RA. For this reason, in the present embodiment, the wire RB prevents (shields) the wire RA from coupling (interference) by the wire RC, the wire RD, and the wire RE, thereby suppressing crosstalk.

Incidentally, the wire RB is desirably arranged between each of the wire RC, the wire RD, and the wire RE, and the wire RA. However, it is essential only that at least some of the wires RB are arranged between at least any of the wire RC, the wire RD, and the wire RE, and the wire RA. Then, the wire RB (shield wire) may be arranged in the pixel substrate 501. Alternatively, the wire RB may be arranged so as to be included in both of the pixel substrate 501 and the signal processing substrate 502.

Further, in the present embodiment, a plurality of connection parts 505 and connection parts 504 are arranged in the pixel region 2. The connection parts 504 and 505 are included in the wire RD, the wire RC, and the wire RE to which crosstalk from the wire RA is desirably suppressed. This is due to the following: the ground, the power supply, and the vertical output line 38 of the pixel substrate 501 may be used for both of the pixel substrate 501 and the signal processing substrate 502 in terms of configuration; and the connection parts 504 and 505 can be a part of the wire RD, the wire RC, and the wire RE. Accordingly, at least some of the wires RB are desirably arranged between the connection part 504 (connection region) of at least any of the wire RC, the wire RD, and the wire RE, and the wire RA.

Further, although the wires RC to RE are assumed to be the power supply wire (first wire), the ground wire (second wire), and the vertical output line of the pixel region, the wires RC to RE may be the control lines (the reset control line 18, the select control line 19, and the transfer control line 17) of the pixel region. Further, the wire RA may only be a wire to which a power supply voltage is supplied. Therefore, the wire RA may be not the second wire 52, but the first wire 51.

Embodiment 2

Figure 6:
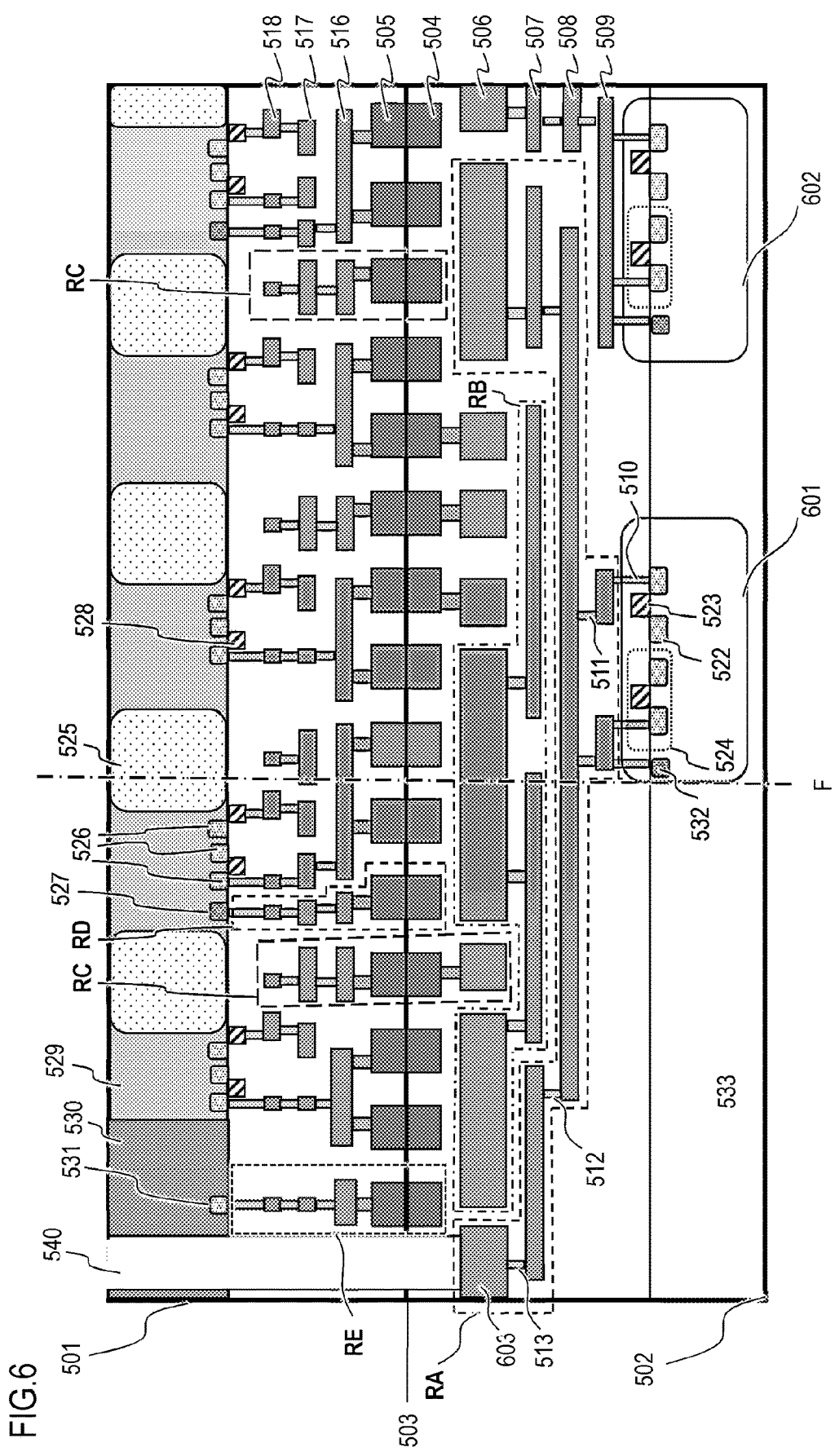
FIG. 6 is a view for illustrating the layer configuration of a solid-state image pickup element in accordance with Embodiment 2.

FIG. 6 is a cross sectional view of a solid-state image pickup element (photoelectric conversion device) in accordance with Embodiment 2. In FIG. 6, the configuration illustrated by reference to FIG. 5 are given the same reference numerals and signs as those of FIG. 5. For this reason, the configuration will not be described.

A processing circuit 601 corresponds to the processing circuit 32 in FIG. 2. A processing circuit 602 corresponds to the AD conversion circuit 31 in FIG. 2. The wires RA to RE in FIG. 6 are the same as the wires RA to RE in FIG. 5. For this reason, the wires RA to RE will not be described.

A boundary F is the part closer to the pad 603 of the boundary portion extending in the lamination direction of the processing circuit 601. At the wire RA as the ground wire of the processing circuit 601, a current particularly concentrates between the boundary F and the pad 603 of the wire RA. This is because the pad 603 is larger relative to the size of the processing circuit 601. For this reason, shielding of the region from the boundary F to the pad 603 of the wire RA (the portion of the wire RA connecting the pad 603 and the processing circuit 601, and the pad 603) with the wire RB as a shield wire is highly effective particularly for crosstalk suppression. Therefore, in the present embodiment, a part of the wire RB is arranged between the region from the boundary F to the pad 603 of the wire RA (the portion of the wire RA connecting the pad 603 and the processing circuit 601), and the wire RC, the wire RD, and the wire RE.

Further, for the region of the wire RA more distant from the pad 603 than the boundary F, a current less concentrates, and hence shielding is less necessary. In the present embodiment, the region in which a current concentrates is selected, and the region is subjected to shielding. As a result, the degree of freedom of layout and crosstalk suppression are made compatible with each other.

Embodiment 3

Figure 7:
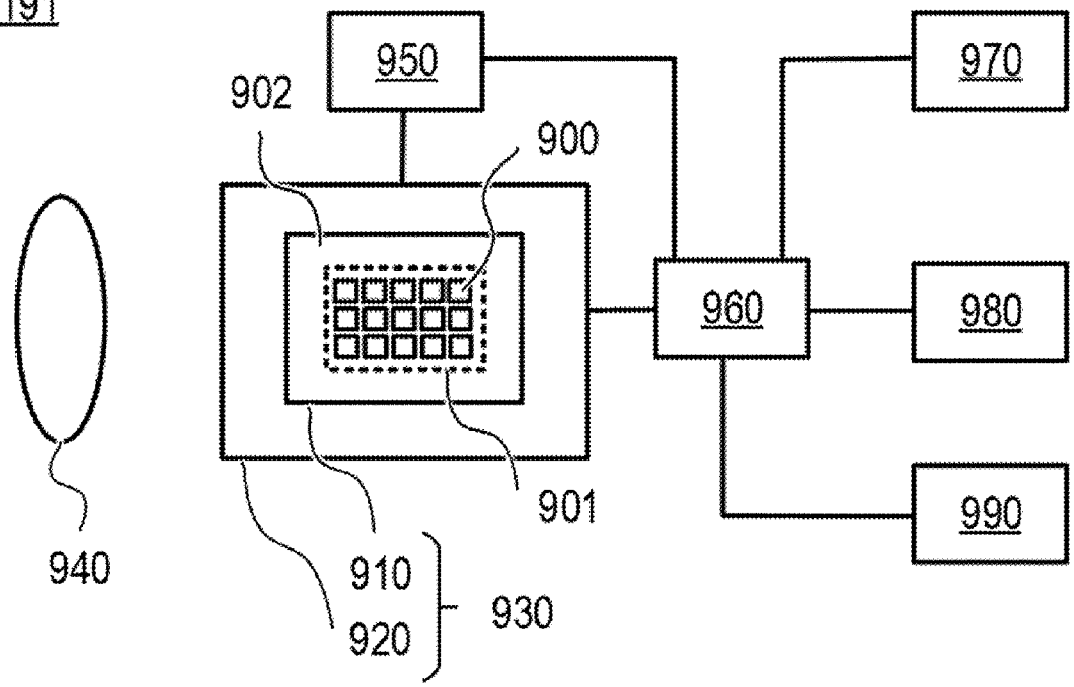
FIG. 7 is a view for illustrating equipment in accordance with Embodiment 3.

Embodiment 3 may be applied to any of Embodiment 1 and Embodiment 2 as described above. FIG. 7 is a schematic view illustrating an equipment 9191 including a semiconductor apparatus 930 according to the present embodiment. The semiconductor apparatus 930 may be any of the solid-state image pickup elements as described Embodiments 1 and 2 or a solid-state image pickup element which can be achieved by a combination of Embodiments 1 and 2. The details of the equipment 9191 including the semiconductor apparatus 930 are described below. The semiconductor apparatus 930 can include, in addition to the semiconductor device 910 including a semiconductor layer, a package 920 for housing the semiconductor device 910. The package 920 can include a substrate to which the semiconductor device 910 is fixed, a lid body made of glass or the like that opposes the semiconductor device 910. The package 920 can further include a joining member such as a bonding wire or a bump that connects a terminal provided on the substrate and a terminal provided on the semiconductor device 910 to each other.

The equipment 9191 can include at least any of the optical apparatus 940, the control apparatus 950, the processing apparatus 960, the display apparatus 970, the storage apparatus 980, and the machine apparatus 990. The optical apparatus 940 corresponds to the semiconductor apparatus 930. The optical apparatus 940 is, for example, a lens, a shutter, and a mirror. The control apparatus 950 controls the semiconductor apparatus 930. The control apparatus 950 is, for example, a semiconductor device such as an ASIC.

The processing apparatus 960 processes signals output from the semiconductor apparatus 930. The processing apparatus 960 is a semiconductor device such as a CPU or an ASIC for constructing an AFE (analog front end) or a DFE (digital front end). The display apparatus 970 is an EL display apparatus or a liquid crystal display apparatus that displays information (an image) obtained by the semiconductor apparatus 930. The storage apparatus 980 is a magnetic device or a semiconductor device that stores information (an image) obtained by the semiconductor apparatus 930. The storage apparatus 980 is a volatile memory such as an SRAM or a DRAM or a nonvolatile memory such as a flash memory or a hard disk drive.

The machine apparatus 990 has a movable portion or a propelling portion such as a motor or an engine. The equipment 9191 displays a signal output from the semiconductor apparatus 930 on the display apparatus 970 or transmits the signal to the outside using a communication apparatus (not illustrated) included in the equipment 9191. Therefore, the equipment 9191 preferably further includes a storage apparatus 980 and a processing apparatus 960 separately from a storage circuit and an arithmetic circuit that are included in the semiconductor apparatus 930. The machine apparatus 990 may be controlled based on a signal output from the semiconductor apparatus 930.

In addition, the equipment 9191 is suitable for an electronic equipment such as an information terminal (for example, a smartphone or a wearable terminal) having a photographic function or a camera (for example, an interchangeable lens camera, a compact camera, a video camera, or a monitoring camera). The machine apparatus 990 in a camera can drive parts of the optical apparatus 940 for the purposes of zooming, focusing, and shutter operations. Alternatively, the machine apparatus 990 in the camera can be configured to move the semiconductor apparatus 930 for a vibration-proof movement.

In addition, the equipment 9191 may be a transportation equipment such as a vehicle, an ocean vessel, or an aircraft. The machine apparatus 990 in the transportation equipment may be used as a moving apparatus. The equipment 9191 as a transportation equipment is suitable as an equipment that transports the semiconductor apparatus 930 or an equipment that assists and/or automates driving (operation) using the photographic function. The processing apparatus 960 for assisting and/or automating driving (operation) can perform processing for operating the machine apparatus 990 as a moving apparatus based on information obtained by the semiconductor apparatus 930. Alternatively, the equipment 9191 may be a medical equipment such as an endoscope, a measuring equipment such as a ranging sensor, an analyzing equipment such as an electron microscope, or an office equipment such as a copier.

According to Embodiment 3 as described above, the equipment 9191 can achieve preferable pixel characteristics. Therefore, the value of the semiconductor apparatus 930 can be improved. The improvement of the value of the semiconductor apparatus 930 falls into any one of addition of functions, improvement of performance, improvement of characteristics, improvement of reliability, improvement of production yield, reduction of environmental load, cost reduction, downsizing, and reduction in weight.

Thus, the value of the equipment 9191 can be improved by applying the semiconductor apparatus 930 of Embodiment 3 to the equipment 9191. For example, when the semiconductor apparatus 930 is implemented to a transportation equipment, preferable performance can be obtained for photographing the outside of the transportation equipment and for environmental measurement of the transportation equipment. Therefore, a decision of implementing the semiconductor apparatus 930 to the transportation equipment for production and distribution of the transportation equipment has an advantage in improving the performance of the transportation equipment itself. In particular, it is preferable to apply the semiconductor apparatus 930 to a transportation equipment that uses information obtained by the semiconductor apparatus 930 to achieve drive assist of the transportation equipment and/or automated driving of the transportation equipment.

Respective embodiments described up to this point, can be appropriately changed within the scope not departing from the technical idea. Incidentally, the contents disclosed in the present specification includes not only the description in the present specification but also all the matters comprehensible from the present specification and the drawings appended in the present specification. Further, the disclosed contents of the present specification includes the complement of the concept described in the present specification. Namely, it can be said as follows: a description in the present specification to the effect that "A is larger than B" discloses to the effect that "A is not larger than B" even when the description to the effect that "A is not larger than B" is omitted. This is because it is a premise that the case where there is a description to the effect that "A is larger than B" is accomplished in consideration of the case where "A is not larger than B".

In accordance with the present invention, it is possible to suppress crosstalk caused at a control line, a ground wire, a power supply wire, or the like at a photoelectric conversion device including a plurality of substrates laminated one on another therein.

Other Embodiments

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-198362, filed on Dec. 7, 2021, which is hereby incorporated by reference herein in its entirety.

What is claimed is:
1. A photoelectric conversion device comprising:
a first substrate and a second substrate laminated one on another,
wherein the first substrate has a pixel region including a photoelectric conversion element for acquiring a pixel signal, wherein the second substrate has a processing circuit for (1) processing the pixel signal, (2) obtaining a digital signal, and (3) performing digital signal processing of the digital signal, wherein a first wire, which is a wire including a plurality of wire layers and which is a common wire to be connected in common with a plurality of pixels in the pixel region, is arranged, wherein a second wire, which is a wire including a plurality of wire layers and which is a wire for supplying a power supply voltage to the processing circuit, is arranged, wherein at least a part of a shield wire, which is not to be electrically connected with any of the first wire and the second wire, is arranged between the first wire and the second wire, and wherein the shield wire extends from one end to another end opposite thereto of the processing circuit in a plan view of the second substrate, and wherein the processing circuit is a circuit for performing gain adjustment of the digital signal.

2. The photoelectric conversion device according to claim 1, wherein the first wire is a power supply wire of the pixel region.

3. The photoelectric conversion device according to claim 1, wherein the first wire is a ground wire of the pixel region.

4. The photoelectric conversion device according to claim 1, wherein the first wire is a vertical output line of the pixel region.

5. The photoelectric conversion device according to claim 1, wherein the first wire is a control line of the pixel region.

6. The photoelectric conversion device according to claim 1, wherein the second wire is a wire different from a ground wire of the processing circuit, and is a power supply wire of the processing circuit.

7. The photoelectric conversion device according to claim 1, wherein the second wire is a ground wire of the processing circuit.

8. The photoelectric conversion device according to claim 1, wherein the first wire has a connection region for connecting the first substrate and the second substrate, and
wherein at least a part of the shield wire is arranged between the connection region and the second wire.

9. The photoelectric conversion device according to claim 1, wherein at least a part of the shield wire is arranged at the second substrate.

10. The photoelectric conversion device according to claim 1, wherein at least a part of the shield wire is arranged at the first substrate.

11. The photoelectric conversion device according to claim 1, wherein the second substrate has a pad to which a voltage is supplied from outside the photoelectric conversion device, and
wherein at least a part of the shield wire is arranged between (1) a portion of the second wire for connecting the pad and the processing circuit, and (2) the first wire.

12. The photoelectric conversion device according to claim 1, wherein the second substrate has a timing generation circuit for supplying a control signal to the processing circuit, and
wherein the shield wire is connected with a ground wire of the timing generation circuit.

13. Equipment comprising:
the photoelectric conversion device according to claim 1; and
at least any of: (1) an optical device adapted to the photoelectric conversion device, (2) a control device for controlling the photoelectric conversion device, (3) a processing device for processing a signal outputted from the photoelectric conversion device, (4) a display device for displaying information acquired at the photoelectric conversion device, (5) a storage device for storing the information acquired at the photoelectric conversion device, and (6) a machine device operating based on the information acquired at the photoelectric conversion device.

14. A photoelectric conversion device comprising:
a first substrate and a second substrate laminated one on another,
wherein the first substrate has a pixel region including a photoelectric conversion element for acquiring a pixel signal,
wherein the second substrate has a processing circuit for (1) processing the pixel signal, (2) obtaining a digital signal, and (3) performing digital signal processing of the digital signal,
wherein a first wire, which is a wire including a plurality of wire layers and which is a common wire to be connected in common with a plurality of pixels in the pixel region, is arranged,
wherein a second wire, which is a wire including a plurality of wire layers and which is a wire for supplying a power supply voltage to the processing circuit, is arranged,
wherein at least a part of a shield wire, which is not to be electrically connected with any of the first wire and the second wire, is arranged between the first wire and the second wire,
wherein the shield wire extends from one end to another end opposite thereto of the processing circuit in a plan view of the second substrate, and
wherein the processing circuit is a circuit for performing sorting of data of the digital signal.

15. Equipment comprising:
the photoelectric conversion device according to claim 14; and
at least any of: (1) an optical device adapted to the photoelectric conversion device, (2) a control device for controlling the photoelectric conversion device, (3) a processing device for processing a signal outputted from the photoelectric conversion device, (4) a display device for displaying information acquired at the photoelectric conversion device, (5) a storage device for storing the information acquired at the photoelectric conversion device, and (6) a machine device operating based on the information acquired at the photoelectric conversion device.

* * * * *